US 11,848,555 B2

(12) United States Patent
Ma et al.

(10) Patent No.: US 11,848,555 B2
(45) Date of Patent: Dec. 19, 2023

(54) METHOD AND SYSTEM FOR EVALUATING STABILITY OF HVDC RECEIVING END SYSTEM, AND STORAGE MEDIUM

(71) Applicant: NORTH CHINA ELECTRIC POWER UNIVERSITY, Beijing (CN)

(72) Inventors: Jing Ma, Beijing (CN); Gengyu Yang, Beijing (CN); Ruifeng Wang, Beijing (CN); Yuchong Wu, Beijing (CN)

(73) Assignee: NORTH CHINA ELECTRIC POWER UNIVERSITY, Beijing (CN)

( * ) Notice: Subject to any disclaimer, the term of this patent is extended or adjusted under 35 U.S.C. 154(b) by 217 days.

(21) Appl. No.: 17/372,374

(22) Filed: Jul. 9, 2021

(65) Prior Publication Data
US 2022/0021213 A1 Jan. 20, 2022

(30) Foreign Application Priority Data
Jul. 15, 2020 (CN) .......................... 202010682160.4

(51) Int. Cl.
*H02J 3/36* (2006.01)
*H02M 7/757* (2006.01)
(Continued)

(52) U.S. Cl.
CPC .............. *H02J 3/36* (2013.01); *H02M 7/7575* (2013.01); *G01R 31/42* (2013.01); *H02J 3/001* (2020.01); *H02P 9/105* (2013.01)

(58) Field of Classification Search
CPC .......... H02J 3/36; H02J 3/001; H02M 7/7575; G01R 31/42; H02P 9/105
See application file for complete search history.

(56) References Cited

U.S. PATENT DOCUMENTS

2012/0150679 A1* 6/2012 Lazaris .................... F03G 6/00
705/26.2

FOREIGN PATENT DOCUMENTS

| CN | 202749815 | * | 2/2013 | ................ H02J 3/14 |
| CN | 103337853 | * | 10/2013 | ................ H02J 1/00 |

(Continued)

OTHER PUBLICATIONS

Hammad, Stability and Control of HVDC and AC Transmissions in Parallel, Oct. 1999, IEEE Transactions on Power Delivery, vol. 14 (Year: 1999).*

(Continued)

*Primary Examiner* — Alexander Satanovsky
*Assistant Examiner* — Sharah Zaab
(74) *Attorney, Agent, or Firm* — Analects Legal LLC

(57) ABSTRACT

The disclosure relates to a method and system for evaluating the stability of HVDC receiving end system and storage medium, which relates to the technical field of high voltage direct current transmission. The method includes: collecting voltage at a generator port, current at the generator port and rotational speed of the generator after eliminating fault; determining a corresponding relationship between the generator dynamic energy and the time according to the voltage at the generator port, the current at the generator port and the rotational speed of the generator; determining the attenuation intensity of the generator dynamic energy according to the corresponding relationship between the generator dynamic energy and the time; determining stability of the HVDC receiving end system according to the attenuation intensity of the generator dynamic energy.

10 Claims, 11 Drawing Sheets

(51) Int. Cl.
  *H02J 3/00* (2006.01)
  *H02P 9/10* (2006.01)
  *G01R 31/42* (2006.01)

(56) References Cited

FOREIGN PATENT DOCUMENTS

| | | | | |
|---|---|---|---|---|
| CN | 108988320 | * | 12/2018 | ............... H02J 3/00 |
| EP | 0197445 | * | 5/2001 | ............ H02M 1/084 |

OTHER PUBLICATIONS

A. E. Hammad, "Stability and control of HVDC and AC transmissions in parallel," IEEE Transactions on Power Delivery, vol. 14, No. 4, pp. 1545-1554, Oct. 1999.

S. Zadkhast, et al., "A multi-decomposition approach for accelerated time-domain simulation of transient stability problems," IEEE Transactions on Power Systems, vol. 30, No. 5, pp. 2301-2311, Sep. 2015.

G. A. Maria, et al., "Hybrid transient stability analysis (power systems)," IEEE Transactions on Power Systems, vol. 5, No. 2, pp. 384-393, May 1990.

M. T. Alam and Q. Ahsan, "A mathematical model for the transient stability analysis of a simultaneous AC-DC power transmission system," IEEE Transactions on Power Systems, vol. 33, No. 4, pp. 3510-3520, Jul. 2018.

J. Tu, et al., "Analysis of the sending-side system instability caused by multiple HVDC commutation failure," CSEE Journal of Power and Energy Systems, vol. 1, No. 4, pp. 37-44, Dec. 2015.

M. Yin, et al., "An improved iterative method for assessment of multi-swing transient stability limit," IEEE Transactions on Power Systems, vol. 26, No. 4, pp. 2023-2030, Nov. 2011.

Z. Shi, et al., "Coordinated emergency control strategy for transient stability enhancement of AC/DC hybrid power systems based on EEAC theory," 2018 IEEE 2nd International Electrical and Energy Conference (CIEEC), Beijing, China, 2018, pp. 88-93.

N. Tarkan and K. Ayan, "The determination of the stability regions via the controlling unstable equilibrium points in AC-DC system transient stability analysis," PowerTech Budapest 99. Abstract Records. (Cat. No. 99EX376), Budapest, Hungary, 1999, p. 277-.

Hsiao-Dong Chang, et al., "Direct stability analysis of electric power systems using energy functions: theory, applications, and perspective," Proceedings of the IEEE, vol. 83, No. 11, pp. 1497-1529, Nov. 1995.

R. Eriksson, "Coordinated control of multiterminal DC grid power injections for improved rotor-angle stability based on Lyapunov theory," IEEE Transactions on Power Delivery, vol. 29, No. 4, pp. 1789-1797, Aug. 2014.

N. Jiang and H. Chiang, "Energy function for power system with detailed DC model: construction and analysis," IEEE Transactions on Power Systems, vol. 28, No. 4, pp. 3756-3764, Nov. 2013.

N. Fernandopulle and R. T. H. Alden, "Improved dynamic security assessment for AC/DC power systems using energy functions," IEEE Transactions on Power Systems, vol. 18, No. 4, pp. 1470-1477, Nov. 2003.

M. A. Pai, et al., "Transient stability analysis of multi-machine AC/DC power systems via energy-function method," IEEE Transactions on Power Apparatus and Systems, vol. PAS-100, No. 12, pp. 5027-5035, Dec. 1981.

Y. Ni and A. A. Fouad, "A simplified two-terminal HVDC model and its use in direct transient stability assessment," IEEE Transactions on Power Systems, vol. 2, No. 4, pp. 1006-1012, Nov. 1987.

Young-Hyun Moon, et al., "Energy conservation law and its application for the direct energy method of power system stability," IEEE Power Engineering Society. 1999 Winter Meeting (Cat. No. 99CH36233), New York, NY, USA, 1999, pp. 695-700, vol. 1.

J. Ma, Y. Shen and A. G. Phadke, "Stability assessment of DFIG subsynchronous oscillation based on energy dissipation intensity analysis," IEEE Transactions on Power Electronics, vol. 35, No. 8, pp. 8074-8087, Aug. 2020.

* cited by examiner

METHOD AND SYSTEM FOR EVALUATING STABILITY OF HVDC RECEIVING END SYSTEM, AND STORAGE MEDIUM

CROSS-REFERENCE TO RELATED APPLICATIONS

This disclosure claims priority to Chinese Patent Disclosure No. 202010682160.4, filed on Jul. 15, 2020, which is hereby incorporated by reference in their entirety.

TECHNICAL FIELD

The disclosure relates to the technical field of high voltage direct current transmission, in particular to a method and system for evaluating stability of HVDC receiving end system and storage medium.

BACKGROUND

AC fault in the HVDC receiving-end system may result in commutation failure in DC system, and successive commutation failure in DC system will interrupt DC transmission power and cause the transient power angle of the receiving-end system to go unstable. Therefore, in order to guarantee the safe and stable operation of AC/DC system, it is urgent to study deeply the problem of transient stability caused by commutation failure due to the AC fault.

Currently, research methods on the stability of transient power angle of AC/DC inter-connected system are mainly divided into a time-domain simulation method, a method of equal area criterion and a method of transient energy function. However, the above-mentioned methods need to solve the differential algebraic equations of the system to obtain the change trajectory of the system state variables and algebraic quantities with time, or need to calculate the unstable equilibrium point of the AC/DC system after fault removal, so the calculation process is complex, thus reducing the efficiency of transient stability assessment.

SUMMARY

In view of the above analysis, the disclosure aims to propose a method and system for evaluating stability of HVDC receiving end system and storage medium, simplify the calculation process, and improve the evaluation efficiency of transient stability.

The goal of the disclosure is mainly realized by the following technical solution:

In the first aspect, the embodiment of the disclosure provides a method for evaluating the stability of the HVDC receiving end system including:

collecting voltage at a generator port, current at the generator port and rotational speed of the generator after fault is eliminated;

determining a corresponding relationship between generator dynamic energy and time according to the voltage at the generator port, the current at the generator port and the rotational speed of the generator;

determining attenuation intensity of the generator dynamic energy according to the corresponding relationship between the generator dynamic energy and the time;

determining stability of the HVDC receiving end system according to the attenuation intensity of the generator dynamic energy.

Furthermore, determining stability of the HVDC receiving end system according to the attenuation intensity of the generator dynamic energy including:

determining that the HVDC receiving end system is in a stable state when the attenuation intensity of the generator dynamic energy is not greater than 0;

determining that the HVDC receiving end system is in an unstable state when the attenuation intensity of the generator dynamic energy is greater than 0;

wherein the attenuation intensity of the generator dynamic energy is change amount of the generator dynamic energy in unit time.

Furthermore, determining that the HVDC receiving end system is in the stable state when the attenuation intensity of the generator dynamic energy is not greater than 0 specifically including as follows:

determining duration that the attenuation intensity of the generator dynamic energy is not greater than 0;

determining that the HVDC receiving end system is in the stable state when the duration reaches the preset time.

Furthermore, determining that the HVDC receiving end system is in the unstable state when the attenuation intensity of the generator dynamic energy is greater than 0 specifically including as follows:

determining duration that the attenuation intensity of the generator dynamic energy is greater than 0;

determining that the HVDC receiving end system is in the unstable state when the duration reaches the preset time.

Furthermore, determining attenuation intensity of the generator dynamic energy according to the corresponding relationship between the generator dynamic energy and the time including:

determining a corresponding relationship between aperiodic components in the generator dynamic energy and the time according to the corresponding relationship between the generator dynamic energy and the time;

determining the attenuation intensity of the generator dynamic energy according to the corresponding relationship between the aperiodic components and the time;

the attenuation intensity of the generator dynamic energy is change amount of the aperiodic components in the generator dynamic energy in unit time.

Furthermore, the corresponding relationship between the generator dynamic energy and the time is expressed by the following formula:

$$W_G = \int \left( i_{Gd} \cdot \frac{du_{Gq}}{dt} - i_{Gq} \cdot \frac{du_{Gd}}{dt} \right) dt + \int (i_{Gd} u_{Gd} + i_{Gq} u_{Gq}) \cdot (\omega - \omega_1) dt$$

where $u_{Gd}$, $u_{Gq}$ are respectively the d and q axis components in voltage at generator port, $i_{Gd}$, $i_{Gq}$ are respectively the d and q axis components in current at generator port, $\omega$ is the rotational speed of the generator, $\omega_1$ is the synchronous speed, $\omega_1 = 100\pi$.

In the second aspect, the embodiment of the disclosure provides a system for evaluating the stability of HVDC receiving end system including: collection device, first processor for calculation of attenuation intensity and second processor for stability determination.

The collection device is used to collect voltage at a generator port, current at the generator port and rotational speed of the generator after fault is eliminated;

The first processor for calculation of attenuation intensity is used to determine a corresponding relationship between generator dynamic energy and time according to the voltage at the generator port, the current at the generator port and the rotational speed of the generator, and then determine the attenuation intensity of the generator dynamic energy according to the corresponding relationship between the generator dynamic energy and the time;

The second processor for stability determination is used to determine stability of the HVDC receiving end system according to the attenuation intensity of the generator dynamic energy.

Furthermore, determining the stability of the HVDC receiving end system according to the attenuation intensity of the generator dynamic energy including:

the second processor for stability determination is used to determine that the HVDC receiving end system is in a stable state when the attenuation intensity of the generator dynamic energy is not greater than 0; determine that the HVDC receiving end system is in an unstable state when the attenuation intensity of the generator dynamic energy is greater than 0; wherein the attenuation intensity of the generator dynamic energy is change amount of the generator dynamic energy in unit time.

Further, the first processor for calculation of attenuation intensity is used to determine a corresponding relationship between aperiodic components in the generator dynamic energy and the time according to the corresponding relationship between the generator dynamic energy and the time; determine the attenuation intensity of the generator dynamic energy according to the corresponding relationship between the aperiodic components and the time; the attenuation intensity of the generator dynamic energy is change amount of the aperiodic components in the generator dynamic energy in unit time.

Furthermore, the corresponding relationship between the generator dynamic energy and the time is expressed by the following formula:

$$W_G = \int \left( i_{Gd} \cdot \frac{du_{Gq}}{dt} - i_{Gq} \cdot \frac{du_{Gd}}{dt} \right) dt + \int (i_{Gd} u_{Gd} + i_{Gq} u_{Gq}) \cdot (\omega - \omega_1) dt$$

Where $u_{Gd}$, $u_{Gq}$ are respectively the d and q axis components in voltage at generator port, $i_{Gd}$ $i_{Gq}$ are respectively the d and q axis components in current at generator port, $\omega$ is the rotational speed of the generator, $\omega_1$ is the synchronous speed, $\omega_1 = 100\pi$.

Beneficial effect of the technical solution of the disclosure is following: the disclosure discloses a method and system for evaluating the stability of the HVDC receiving end system, which can obtain the dynamic energy of the receiving end generator after the fault of the HVDC receiving end system is eliminated. Then, according to the obtained dynamic energy, the attenuation intensity of generator dynamic energy is constructed. Finally, the stability of HVDC receiving end system is evaluated by the attenuation intensity of generator dynamic energy. Among them, the attenuation intensity of generator dynamic energy is the change amount of generator dynamic energy in unit time. Compared with the prior art, the embodiment of the disclosure does not need to solve the differential algebraic equations of the system to obtain the change trajectory of the system state quantity and algebraic quantity with time, and does not need to calculate the unstable equilibrium point of the AC/DC system after fault removal, and only needs to collect voltage and current data at the port to calculate the dynamic energy at the port. Therefore, the technical solution provided by the disclosure has strong adaptability and short consuming time, thus improving the evaluation efficiency of transient stability.

Other features and advantages of the disclosure will be set forth in subsequent specifications and partly will become apparent from the description or understood by implementing the disclosure. The object and other advantages of the disclosure can be realized and obtained by the structure specially pointed out in the description, claims and drawings.

BRIEF DESCRIPTION OF DRAWINGS

The drawings are only for the purpose of showing specific embodiments and are not considered to be a limitation of the disclosure. Throughout the drawings, the same reference symbols represent the same components.

DESCRIPTION OF EMBODIMENTS

Preferred embodiments of the present disclosure are described in detail with the accompanying drawings, which form a part of the present disclosure and are used together with the embodiments of the present disclosure to explain the principles of the present disclosure and are not intended to limit the scope of the disclosure.

HVDC receiving end system refers to the AC system connected to a inverter side of HVDC transmission system, including port of DC inverter side, AC transmission lines, load, AC filter and synchronous generator. The port of DC inverter side, load and AC filter are located on the inverter side, and are connected to a synchronous generator through AC transmission lines.

Figure 1:
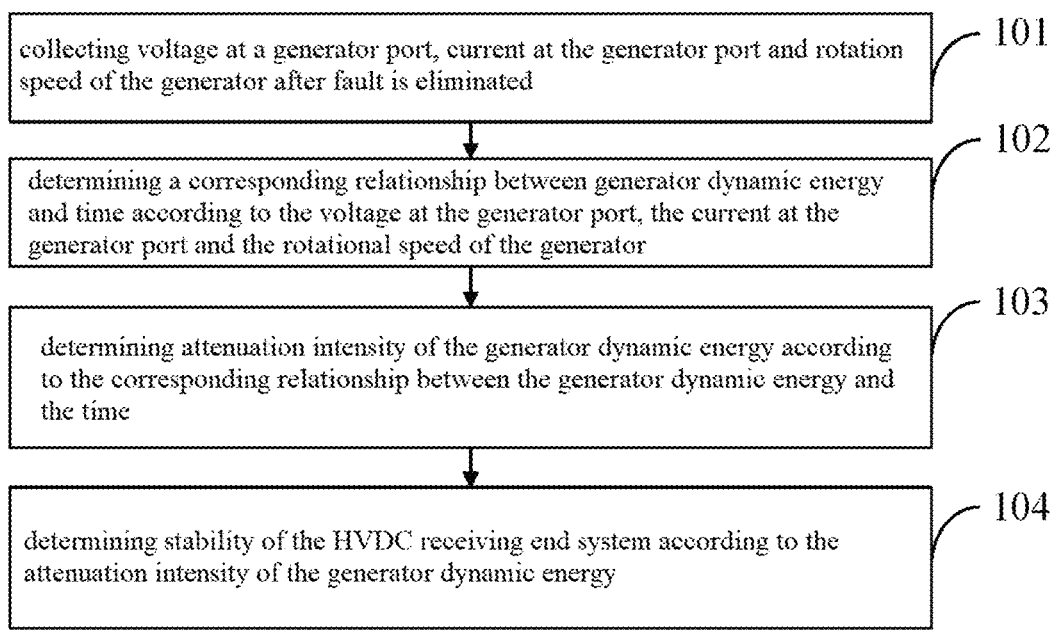
FIG. 1 is a flow chart of a method for evaluating the stability of the HVDC receiving end system provided by the disclosure.

The embodiment of the disclosure provides a method for evaluating stability of HVDC receiving end system, as shown in FIG. 1, including the following steps:

Step 101: collecting the voltage at a generator port, the current at the generator port and the rotational speed of the generator after eliminating fault.

In the embodiment of the disclosure, the receiving end system is prone to three-phase grounding fault, and the fault is eliminated by removing the three-phase grounding fault. The impedance of HVDC receiving end system includes equivalent reactance of converter transformer, inductance of whole lines and reactance and resistance of other devices included in HVDC receiving end system.

Step 102, according to the voltage at the generator port, the current at the generator port and the rotational speed of the generator, determining a corresponding relationship between generator dynamic energy and time.

In the embodiment of the disclosure, the general expression of the corresponding relationship between the generator dynamic energy and the time is as follows:

$$W_G = \int \left( i_{Gd} \cdot \frac{du_{Gq}}{dt} - i_{Gq} \cdot \frac{du_{Gd}}{dt} \right) dt + \int (i_{Gd} u_{Gd} + i_{Gq} u_{Gq}) \cdot (\omega - \omega_1) dt$$

Where $u_{Gd}$, $u_{Gq}$ are respectively the d and q axis components in voltage at the generator port, $i_{Gd}$, $i_{Gg}$ are respectively the d and q axis components in current at the generator port, $\omega$ is the rotational speed of the generator, $\omega_1$ is the synchronous speed, $\omega_1 = 100\pi$.

Step 103: determining attenuation intensity of the generator dynamic energy according to the corresponding relationship between the generator dynamic energy and the time.

In the embodiment of the disclosure, a corresponding relationship between aperiodic components in the generator dynamic energy and the time is determined according to the general expression in step 102. According to the corresponding relationship between the aperiodic components and the time, the attenuation intensity of generator dynamic energy is determined. Among them, the attenuation intensity of generator dynamic energy is the change amount of aperiodic components in generator dynamic energy in unit time.

Figure 2:
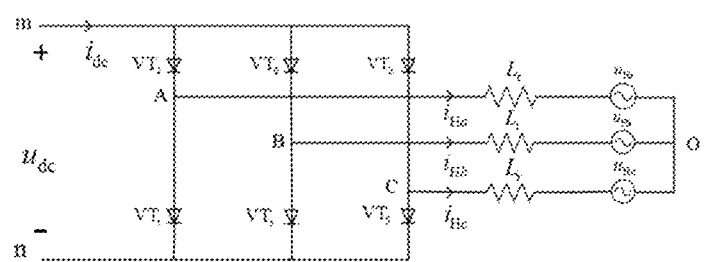
FIG. 2 shows a diagram of the topological structure of the inverter provided by the embodiment of the disclosure.

It should be noted that when AC fault occurs in the HVDC receiving end system, the embodiment of the disclosure adopts the aperiodic components in the generator dynamic energy to describe the dynamic energy change caused by the fault. Due to AC fault of the HVDC receiving end system, inverter will appear a variety of commutation failure topologies, as shown in Table 1 and FIG. 2. In FIG. 2, VT1-VT6 are six thyristors, A, B and C respectively represent one phase in the three-phase circuit, and other symbols are general symbols in the art, respectively representing voltage, current, inductance and positive and negative poles of power supply. However, the existence time of each topology and the change of aperiodic components caused by each topology are different, which makes the change of generator dynamic energy exist multiple stages during fault. Therefore, the aperiodic components of generator dynamic energy can be used to show the change trend of generator dynamic energy during fault period.

TABLE I

Topologies of inverter in the case of different commutation failure

| Conducting state of thyristors | Equivalent fault |
| --- | --- |
| 6 thyristors conducted | three-phase short circuit fault of Inverter |
| 5 thyristors conducted | |
| 4 thyristors conducted, and at least one thyristor in each phase conducted | |
| 4 thyristors in either two phases conducted | phase-to-phase short circuit fault of Inverter |
| 3 thyristors in either two phases conducted | |
| 2 thyristors in the same phase conducted | three-phase open circuit fault of Inverter |

It can be seen that stability of HVDC receiving end system is evaluated by using the change amount of aperiodic components of generator dynamic energy in unit time, validity of the stability evaluation results of HVDC receiving end system can be guaranteed.

Specifically, when the inverter switches to the topology of two-phase short-circuit, the aperiodic components of the generator dynamic energy are as follows:

$$W_{G(i)}^A = \int \left[ \frac{(2-k)\left(1+\frac{1}{1-k}\right)+\left(2-\frac{3}{2}k\right)\frac{L_L}{L_r}}{k(2-k)\left(1+\frac{1}{1-k}+\frac{L_L}{L_r}\right)} \cdot \frac{\lambda U_m^2}{L_L} \cdot \frac{e^{2\lambda t}}{\left(\lambda+\frac{R_1}{L_1}\right)^2+\omega^2} \cdot \omega + \right.$$

$$\left. \frac{1}{(M+2N)} \cdot \frac{\lambda U_m^2}{L_r} \cdot \frac{e^{2\lambda t}}{\lambda^2+\omega^2} \cdot \frac{\omega}{2} \right] dt +$$

$$\int \left[ \left( \frac{(M+N)}{M(M+2N)(1-k)} + \frac{1}{k} \right) \frac{U_m^2}{L_L} \cdot \frac{e^{2\lambda t}}{\left(\lambda+\frac{R_1}{L_1}\right)^2+\omega^2} \cdot \left(\lambda+\frac{R_1}{L_1}\right) + \right.$$

$$\left. \frac{1}{(M+2N)} \cdot \frac{U_m^2}{L_r} \cdot \frac{e^{2\lambda t}}{\lambda^2+\omega^2} \cdot \frac{1}{2}\lambda \right] \cdot (\omega-\omega_1) dt$$

When the inverter switches to the topology of three-phase short-circuit, the aperiodic components of the generator dynamic energy are as follows:

$$W_{G(j)}^A =$$

$$\int \left\{ \left[ \frac{1}{k} + \frac{1}{\left(1+\frac{L_L}{L_r}\right)(1-k)+1} \right] \cdot \frac{U_m^2}{L_L} \cdot \frac{\lambda\omega+\left(\frac{R_1}{L_1}+\lambda\right)(\omega-\omega_1)}{\left(\frac{R_1}{L_1}+\lambda\right)^2+\omega^2} \cdot e^{2\lambda t} \right\} dt +$$

$$\int \left( \frac{1}{1+\frac{1}{1-k}+\frac{L_L}{L_r}} \cdot \frac{U_m^2}{L_r} \cdot \frac{\lambda(2\omega-\omega_1)}{\lambda^2+\omega^2} \cdot e^{2\lambda t} \right) dt$$

When the inverter switches to the topology of three-phase open circuit, the aperiodic components of the generator dynamic energy in this stage are as follows:

$$W_{G(k)}^A = \int \left[ \frac{2}{k(2-k)} \cdot \frac{U_m^2}{L_L} \cdot \frac{\lambda\omega + \left(\frac{R_1}{L_1} + \lambda\right) \cdot (\omega - \omega_1)}{\left(\frac{R_1}{L_1} + \lambda\right)^2 + \omega^2} \cdot e^{2\lambda t} \right] dt$$

Step 104, according to the attenuation intensity of generator dynamic energy, determining stability of HVDC receiving end system. Specifically, when the attenuation intensity of generator dynamic energy is not greater than 0, the system can maintain transient stability; when the attenuation intensity of generator dynamic energy is greater than 0, the system will be transient unstable. It should be noted that the attenuation intensity of the generator dynamic energy is not greater than 0, which means that the duration of the attenuation intensity being not greater than 0 reaches the preset time, for example, when the duration of the attenuation intensity being not greater than 0 is 10 seconds, confirm that the attenuation intensity of the generator dynamic energy is not greater than 0. In the same way, the attenuation intensity of the generator dynamic energy being greater than 0 means that the duration of the attenuation intensity being greater than 0 reaches the preset time.

In the prior art, in order to calculate the energy change of the generator, it is usually necessary to calculate the average value of the detected current and determine the energy change of the generator according to the average value. However, during the fault duration, due to the change of the circuit connection state, the energy of other components at the receiving end system will change with time, for example, the output current at the port of the DC inverter side will change with time after the fault. Similarly, after fault recovery, the energy of other components in the receiving end system will also change with time. Therefore, only taking the average value can not reflect the influence of other components in the receiving end on the energy change of the whole system.

In the embodiment of the disclosure, under the DC commutation failure and the disturbance of the fault point, the generator rotor accelerates and the power angle swings. In this process, the dynamic energy will be emitted by generator and be absorbed by other components at the receiving end. Therefore, the dynamic energy of generator can reflect the change of the total energy of the system and the influence of other components at the receiving end on the energy change of the whole system.

According to Lyapunov's second theorem, after a system is disturbed, the state variables will deviate from the equilibrium point, and the system will gain certain energy. If the overall energy of system gradually attenuates and finally reaches the minimum value, i.e. the equilibrium state as time goes on, the system is stable. Otherwise, if the overall energy of system keeps increasing, the system is not stable.

For the generator dynamic energy, if the dynamic energy injected into the receiving end system by generator keeps decreasing, system overall energy will finally decrease to the energy at equilibrium point, i.e. the system will finally return to be stable. Otherwise, if the dynamic energy injected into the receiving end system by generator keeps increasing to continue to provide energy for unstable system, system overall energy will keep increasing, and the system will finally go unstable.

Figure 3:
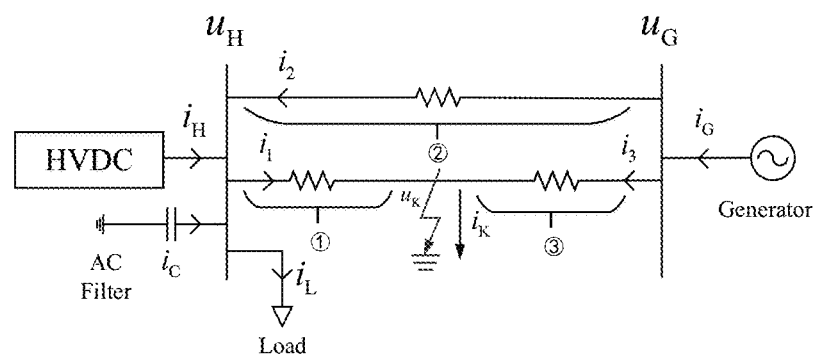
FIG. 3 shows a structure diagram of the HVDC system circuit provided by the embodiment of the disclosure.

In the embodiment of the disclosure, the attenuation intensity of the generator dynamic energy is based on the dynamic energy conservation of the receiving end system. After the fault occurs, the circuit of HVDC receiving end system is shown in FIG. 3, $u_H$ represents the AC bus voltage at the inverter side; $u_G$ represents the bus voltage at the generator outlet; $u_K$ represents the voltage at the fault point; $i_H$ represents the current injected into the AC system by the inverter; $i_C$ represents the current of AC filter; $i_L$ represents load current; $i_G$ represents current output by the generator; $i_K$ represents the current injected into the ground at the fault point; $i_1$, $i_2$, $i_3$ represent the current on three-segment lines; HVDC represent high voltage direct current transmission system.

According to FIG. 3, the dynamic energy conservation equation of HVDC system can be obtained:

$$W_{HVDC} + W_{Ln1} + W_{Ln3} + W_L + W_C + W_G + W_{Ln2} = 0$$

Where $W_{HVDC}$, $W_{Ln1}$, $W_{Ln3}$ represent the dynamic energy at DC port and fault lines 1, 3 respectively, $W_L$, $W_C$, $W_G$, $W_{Ln2}$ represent the dynamic energy of load, AC filter, generator and non-fault line 2 respectively. According to the dynamic energy conservation equation, the generator dynamic energy is affected by the dynamic energy at DC port and fault lines.

In HVDC receiving end system, DC port absorbs dynamic energy when the inverter works in the topologies of phase-to-phase short circuit and three-phase short circuit, but does not accumulate dynamic energy when the inverter works in the topology of three-phase open circuit. The fault lines accumulate dynamic energy when the inverter works in the topologies of phase-to-phase short circuit, three-phase short circuit and three-phase open circuit. As the dynamic energy absorbed by DC port and fault lines is accumulating, it is easy to increase the dynamic energy of generator, which is not conducive to the stable operation of the system. Therefore, the dynamic energy change at DC port and dynamic energy of fault lines plays a leading role in the change of the generator dynamic energy. The influence of dynamic energy at DC port and dynamic energy of fault lines on dynamic energy of generator is described in detail below.

1. Dynamic Energy at DC Port

Taking the injection node as the positive direction, the dynamic energy at DC port can be expressed as follows:

$$W_{HVDC} = \int i_{Hd} du_{Hq} - \int i_{Hq} du_{Hd} + \int (i_{Hd} u_{Hd} + i_{Hq} u_{Hq}) d\delta =$$
$$\int \left( i_{Hd} \cdot \frac{du_{Hq}}{dt} - i_{Hq} \cdot \frac{du_{Hd}}{dt} \right) dt + \int (i_{Hd} u_{Hd} + i_{Hq} u_{Hq}) \cdot (\omega - \omega_1) dt$$

Where $u_{Hd}$, $u_{Hq}$ are respectively the d and q axis components in voltage at DC port, $i_{Hd}$, $i_{Hq}$ are respectively the d and q axis components in current at DC port, $\omega$ is the rotational speed of the generator, $\omega_1$ is the synchronous speed, $\omega_1 = 100\pi$.

According to table 1, the dynamic energy accumulated at DC port in the whole fault process can be expressed as follows:

$$W_{HVDC} = \Sigma W_{HVDC(i)} + \Sigma W_{HVDC(j)} + \Sigma W_{HVDC(k)}$$

Where $\Sigma W_{HVDC(i)}$ represents the dynamic energy of inverter in the case of three-phase short circuit, $\Sigma W_{HVDC(j)}$ represents the dynamic energy of inverter in the case of two-phase short circuit, $\Sigma W_{HVDC(k)}$ represents the dynamic energy of inverter in the case of three-phase open circuit.

There are three types of dynamic energy at the DC port under equivalent topology:

1) When the inverter switches to the topology of two-phase short-circuit, the dynamic energy at the DC port in this stage is as follows:

$$W_{HVDC(i)} = $$

$$\int \left\{ -\frac{U_m^2}{L_r} \cdot \frac{\lambda}{M} \cdot \left[ \frac{e^{2\lambda t}}{\lambda^2 + \omega^2} \cdot \left( \frac{\sqrt{\lambda^2 + \omega^2}}{2} \sin(2\omega t + \varphi_5) + \frac{\omega}{2} \right) + \right.\right.$$

$$\left. C_{H3} \cdot e^{\lambda t} \sin\omega t \right] - \frac{U_m^2}{L_r} \cdot \frac{2\omega N}{M} \cdot \left[ \frac{e^{2\lambda t}}{\lambda^2 + \omega^2} \cdot \right.$$

$$\left( \frac{\sqrt{\lambda^2 + \omega^2}}{2} \sin(2\omega t + \varphi_6) + \frac{\lambda}{2} \right) + C_{H3} \cdot e^{\lambda t} \cos\omega t \right] \Bigg\} dt +$$

$$\int \left\{ -\frac{1}{(M+2N)^2} \cdot \frac{U_m^2}{L_r} \cdot \left[ \frac{e^{2\lambda t}}{\lambda^2 + \omega^2} \cdot \left( \frac{\sqrt{\lambda^2 + \omega^2}}{2} \sin(2\omega t + \varphi_6) + \frac{\lambda}{2} \right) + \right.\right.$$

$$\left. C_{H3} \cdot e^{\lambda t} \cos\omega t \right] \Bigg\} \cdot (\omega - \omega_1) dt$$

Where $\varphi_5$, $\varphi_6$ are phase angles generated from merging trigonometric function terms with the same frequency, $C_{H3}$ is the constant generated in the integrating process. The expressions of coefficients M and N are respectively:

$$M = 1 + \frac{1}{1-k}, N = \frac{L_L}{2L_r},$$

where k is the percentage of the length of Line 3 in the whole line length, $L_L$ is the inductance of the whole line length, $L_r$ is the equivalent reactance of converter transformer. $\omega$ is the rotational speed of the generator, $\omega_1$ is the synchronous speed. $\lambda$ is the increasing amplitude coefficient of the bus voltage at generator outlet. $U_m$ is the initial amplitude of the bus voltage at generator outlet during fault steady state, e is a constant, t represents time.

2) When the inverter switches to the topology of three-phase short-circuit, the dynamic energy at the DC port at this stage is as follows:

$$W_{HVDC(j)} = $$

$$\int \left[ \frac{1}{\left(1 + \frac{1}{1-k} + \frac{L_L}{L_r}\right)^2} \cdot \frac{\lambda U_m^2}{L_r} \cdot \sqrt{C_{H1}^2 + \frac{1}{3}(2C_{H2} - C_{H1})^2} \cdot e^{\lambda t} \cdot \right.$$

$$\left. \sin(\omega t + \varphi_1) - \frac{1}{\left(1 + \frac{1}{1-k} + \frac{L_L}{L_r}\right)^2} \cdot \frac{U_m^2}{L_r} \cdot \frac{\lambda \omega e^{2\lambda t}}{\lambda^2 + \omega^2} \right] dt +$$

$$\int \left[ -\frac{1}{\left(1 + \frac{1}{1-k} + \frac{L_L}{L_r}\right)^2} \cdot \frac{U_m^2}{L_r} \cdot \frac{\lambda}{\lambda^2 + \omega^2} \cdot e^{2\lambda t} - \right.$$

$$\frac{1}{\left(1 + \frac{1}{1-k} + \frac{L_L}{L_r}\right)^2} \cdot \frac{U_m^2}{L_r} \cdot \sqrt{C_{H1}^2 + \frac{1}{3}(2C_{H2} - C_{H1})^2} \cdot e^{\lambda t} \cdot s$$

$$\left. in(\omega t + \varphi_2) \right] \cdot (\omega - \omega_1) dt$$

Where $\varphi_1$, $\varphi_2$ are phase angles generated from merging trigonometric function terms with the same frequency, $C_{H1}$, $C_{H2}$ are the constants generated in the integrating process. k the percentage of the length of Line 3 in the whole line length, $L_L$ is the inductance of the whole line length, $L_r$ is the equivalent reactance of converter transformer. $\omega$ is the rotational speed of the generator, $\omega_1$ is the synchronous speed. $\lambda$ is the increasing amplitude coefficient of bus voltage at the generator outlet. $U_m$ is the initial amplitude of the bus voltage at the generator outlet during fault steady state, e is a constant, t represents time.

3) When the inverter switches to the topology of three-phase open circuit, it is easy to infer from table 1 that change amount of the dynamic energy at DC port in this stage is 0, which is equivalent to no accumulation. For example, in FIG. 2, only thyristors VT1 and VT4 are on, and the rest of thyristors are off. Obviously, the power source is in open circuit state, so change amount of the dynamic energy at DC port is 0.

It can be seen that different topologies of commutation failure correspond to different dynamic energy at DC port, and each topology changes with time. Therefore, the dynamic energy at DC port also changes with time, thus affecting the dynamic energy change of generator.

2. Dynamic Energy of Fault Lines

Taking the injection node as the positive direction, the dynamic energy of fault line 1 can be expressed as follows:

$$W_{ln1} = $$

$$\int \text{Im}(-i_1^* du_H) = -\int i_{1d} du_{Hq} + \int i_{1q} du_{Hd} - \int (u_{Hd} i_{1d} + u_{Hq} i_{1q}) d\delta =$$

$$-\int \left( i_{Hd} \cdot \frac{du_{Hq}}{dt} - i_{Hq} \cdot \frac{du_{Hd}}{dt} \right) dt - \int (u_{Hd} i_{1d} + u_{Hq} i_{1q}) \cdot (\omega - \omega_1) dt$$

Where $u_{Hd}$, $u_{Hq}$ are respectively the d and q axis components in voltage at DC port, $i_{1d}$ $i_{1q}$ are respectively the d and q axis components of fault line 1, $\omega$ is the rotational speed of the generator, $\omega_1$ is the synchronous speed, $\omega_1 = 100\pi$.

Since the fault line 1 is connected with the DC port, the dynamic energy of the fault line 1 is also affected by various equivalent topologies of the inverter, while the fault line 3 is not connected with the DC port, so the dynamic energy of the fault line 3 will not be affected by the various equivalent topologies of the inverter. It can be seen that the accumulated dynamic energy of fault line 1 in the whole fault process can be expressed as follows:

$$W_{Ln1} = \Sigma W_{Ln1(i)} + \Sigma W_{Ln1(j)} + \Sigma W_{Ln1(k)}$$

Where $\Sigma W_{Ln1(i)}$ represents the dynamic energy of inverter in the case of three-phase short circuit, $\Sigma W_{Ln1(j)}$ represents the dynamic energy of inverter in the case of two-phase short circuit, $\Sigma W_{Ln1(k)}$ represents the dynamic energy of inverter in the case of three-phase open circuit.

The dynamic energy of the faulty lines is analyzed respectively when the inverter switches to three kinds of equivalent topologies.

1) When the inverter switches to the topology of two-phase short-circuit, the dynamic energy of line 1 at this stage is as follows:

$$W_{Ln1(i)} = \int \left[ -\frac{M+N}{2M^2(M+2N)} \cdot \frac{U_m^2}{(1-k)L_L} \cdot \frac{\lambda \omega e^{2\lambda t}}{\left(\lambda + \frac{R_1}{L_1}\right)^2 + \omega^2} \cdot (1 + \cos 2\omega t) - \right.$$

$$\frac{M+N}{2M(M+2N)^2} \cdot \frac{U_m^2}{(1-k)L_L} \cdot \frac{\lambda \omega e^{2\lambda t}}{\left(\lambda + \frac{R_1}{L_1}\right)^2 + \omega^2} \cdot (1 - \cos 2\omega t) -$$

$$\left. \frac{2N(M+N)}{M^2(M+2N)^2} \cdot \frac{U_m^2}{(1-k)L_L} \cdot \frac{\omega^2 e^{2\lambda t}}{\left(\lambda + \frac{R_1}{L_1}\right)^2 + \omega^2} \cdot \sin 2\omega t \right] dt +$$

$$\int \left[ -\frac{2N(M+N)}{M^2(M+2N)^2} \cdot \frac{U_m^2}{(1-k)L_L} \cdot \frac{\omega e^{2\lambda t}}{\left(\lambda + \frac{R_1}{L_1}\right)^2 + \omega^2} \cdot \sin(2\omega t) \right] \cdot (\omega - \omega_1) dt$$

Where $R_1$, $L_1$ represents the resistance and inductance of line 1.

2) When the inverter switches to the topology of three-phase short-circuit, the dynamic energy of line 1 at this stage is as follows:

$$W_{Ln1(i)} = \int \left[ -\frac{1}{\left(1 + \frac{1}{1-k} + \frac{L_L}{L_r}\right)^2} \cdot \frac{U_m^2}{(1-k)L_L} \cdot \frac{\lambda \omega e^{2\lambda t}}{\left(\frac{R_1}{L_1} + \lambda\right)^2 + \omega^2} + \right.$$

$$\frac{1}{\left(1 + \frac{1}{1-k} + \frac{L_L}{L_r}\right)^2} \cdot \frac{\lambda U_m^2}{(1-k)L_L} \cdot$$

$$\left. \sqrt{C_1^2 + \frac{1}{3}(2C_2 + C_1)^2} \cdot e^{\left(\lambda - \frac{R_1}{L_1}\right)t} \cdot \sin(\omega t + \varphi_3) \right] dt +$$

$$\int \left[ -\frac{1}{\left(1 + \frac{1}{1-k} + \frac{L_L}{L_r}\right)^2} \cdot \frac{U_m^2}{(1-k)L_L} \cdot \frac{\frac{R_1}{L_1} + \lambda}{\left(\frac{R_1}{L_1} + \lambda\right)^2 + \omega^2} \cdot e^{2\lambda t} - \right.$$

$$\frac{1}{\left(1 + \frac{1}{1-k} + \frac{L_L}{L_r}\right)^2} \cdot \frac{U_m^2}{(1-k)L_L} \cdot \sqrt{C_1^2 + \frac{1}{3}(2C_2 + C_1)^2} \cdot$$

$$\left. e^{\left(\lambda - \frac{R_1}{L_1}\right)t} \cdot \sin(\omega t + \varphi_4) \right] \cdot (\omega - \omega_1) dt$$

3) When the inverter switches to the topology of three-phase open circuit, the dynamic energy of line 1 at this stage is as follows:

$$W_{Ln1(1)} = \int \left[ -\frac{1}{\left(1 + \frac{1}{1-k}\right)^2} \cdot \frac{U_m^2}{(1-k)L_L} \cdot \frac{\lambda \omega e^{2\lambda t}}{\left(\frac{R_1}{L_1} + \lambda\right)^2 + \omega^2} + \frac{1}{\left(1 + \frac{1}{1-k}\right)^2} \cdot \right.$$

$$\left. \frac{\lambda U_m^2}{(1-k)L_L} \cdot \sqrt{C_1^2 + \frac{1}{3}(2C_2 + C_1)^2} \cdot e^{\left(\lambda - \frac{R_1}{L_1}\right)t} \cdot \sin(\omega t + \varphi_3) \right] dt$$

The dynamic energy of fault line 3 is as follows:

$$W_{Ln3(i)} =$$

$$\int \left[ -\frac{U_m^2}{kL_L} \cdot \frac{\lambda \omega e^{2\lambda t}}{\left(\frac{R_3}{L_3} + \lambda\right)^2 + \omega^2} + \frac{\lambda U_m^2}{kL_L} \cdot \sqrt{C_1^2 + \frac{1}{3}(2C_2 + C_1)^2} \cdot e^{\left(\lambda - \frac{R_3}{L_3}\right)t} \cdot \right.$$

$$\left. \sin(\omega t + \varphi_3) \right] dt + \int \left[ -\frac{U_m^2}{kL_L} \cdot \frac{\frac{R_3}{L_3} + \lambda}{\left(\frac{R_3}{L_3} + \lambda\right)^2 + \omega^2} \cdot e^{2\lambda t} - \right.$$

$$\left. \frac{U_m^2}{kL_L} \cdot \sqrt{C_1^2 + \frac{1}{3}(2C_2 + C_1)^2} \cdot e^{\left(\lambda - \frac{R_3}{L_3}\right)t} \cdot \sin(\omega t + \varphi_4) \right] \cdot (\omega - \omega_1) dt$$

Where $R_3$, $L_3$ represent the resistance and inductance of line 3 respectively, $C_1$, $C_2$ are the constants generated in the integrating process.

It can be seen that different topologies of commutation failure correspond to different dynamic energy of fault line 1, and each topology changes with time. Therefore, the dynamic energy of fault line 1 also changes with time, that is, the dynamic energy of the whole fault line changes with time, and the above energy change will affect the dynamic energy change of the generator.

3. Dynamic Energy of Generator

Although in the HVDC receiving end system, the dynamic energy change at the DC port and the dynamic energy change of the fault lines play a leading role in the dynamic energy change of the generator, in order to accurately calculate the dynamic energy change of the generator, in the embodiment of the disclosure, the dynamic energy change of the load and AC filter is also taken into account. The general formula of the corresponding relationship between the generator dynamic energy and time obtained in step 102 can be deduced as follows:

1) When the inverter switches to the topology of two-phase short circuit, the generator dynamic energy at this stage is as follows:

$$W_{G(i)} =$$

$$\int \left\{ -\frac{\lambda U_m^2}{M(1-k)L_L} \cdot \frac{e^{2\lambda t}}{\left(\lambda + \frac{R_1}{L_1}\right)^2 + \omega^2} \cdot \left( \frac{\lambda + \frac{R_1}{L_1}}{2} \cdot \sin 2\omega t - \frac{\omega}{2} \cdot \cos \omega t + \right. \right.$$

$$\left. \frac{\omega}{2} \right) - \frac{\lambda C_3 U_m^2}{M(1-k)L_L} \cdot e^{\left(\lambda - \frac{R_1}{L_1}\right)t} \cdot \cos \omega t + \frac{\lambda U_m^2}{(M+2N)(1-k)L_L} \cdot$$

-continued $$\frac{e^{2\lambda t}}{\left(\lambda+\frac{R_1}{L_1}\right)^2+\omega^2}\cdot\left[-\frac{\omega}{2}\cdot\cos 2\omega t+\frac{1}{2}\left(\lambda+\frac{R_1}{L_1}\right)\cdot\sin 2\omega t+\frac{\omega}{2}\right]-$$

$$\frac{\sqrt{3}\,\lambda(C_4-C_3)U_m^2}{3M(M+2N)(1-k)L_L}\cdot e^{\left(\lambda-\frac{R_1}{L_1}\right)t}\cdot\sin\omega t+$$

$$\frac{\lambda U_m^2}{kL_L}\cdot\frac{e^{2\lambda t}}{\left(\lambda+\frac{R_1}{L_1}\right)^2+\omega^2}\cdot\omega-$$

$$\frac{\lambda U_m^2}{kL_L}\cdot e^{\left(\lambda-\frac{R_1}{L_1}\right)t}\cdot\sqrt{C_1^2+\frac{1}{3}(2C_2+C_1)^2}\cdot\sin(\omega t+\varphi_3)+$$

$$\frac{\lambda U_m^2}{(M+2N)L_r}\cdot\left[\frac{e^{2\lambda t}}{\lambda^2+\omega^2}\cdot\left(-\frac{\omega}{2}\cdot\cos 2\omega t+\frac{\lambda}{2}\sin 2\omega t+\frac{\omega}{2}\right)+\right.$$

$$\left. C_{H3}\cdot e^{\lambda t}\cdot\sin\omega t\right]\bigg\}dt+$$

$$\int\Bigg\{\Bigg[\frac{U_m^2}{M(1-k)L_L}\cdot\frac{e^{2\lambda t}}{\left(\lambda+\frac{R_1}{L_1}\right)^2+\omega^2}\cdot\Bigg[-\frac{\lambda+\frac{R_1}{L_1}}{2}\cdot\cos 2\omega t-$$

$$\frac{\omega}{2}\cdot\sin 2\omega t+\frac{1}{2}\left(\lambda+\frac{R_1}{L_1}\right)\Bigg]+\frac{C_3 U_m^2}{M(1-k)L_L}\cdot e^{\left(\lambda-\frac{R_1}{L_1}\right)t}\cdot\sin\omega t+$$

$$\frac{U_m^2}{(M+2N)(1-k)L_L}\cdot\frac{e^{2\lambda t}}{\left(\lambda+\frac{R_1}{L_1}\right)^2+\omega^2}\cdot\Bigg[\frac{\omega}{2}\sin 2\omega t+$$

$$\frac{\lambda+\frac{R_1}{L_1}}{2}\cdot\cos 2\omega t+\frac{1}{2}\left(\lambda+\frac{R_1}{L_1}\right)\Bigg]-\frac{\sqrt{3}\,\lambda(C_4-C_3)U_m^2}{3M(M+2N)(1-k)L_L}\cdot$$

$$e^{\left(\lambda-\frac{R_1}{L_1}\right)t}\cdot\cos\omega t+\frac{U_m^2}{kL_L}\cdot\frac{e^{2\lambda t}}{\left(\lambda+\frac{R_1}{L_1}\right)^2+\omega^2}\cdot\left(\lambda+\frac{R_1}{L_1}\right)+$$

$$\frac{U_m^2}{kL_L}\cdot\sqrt{C_1^2+\frac{1}{3}(2C_2+C_1)^2}\cdot e^{\left(\lambda-\frac{R_2}{L_2}\right)t}\cdot\sin(\omega t+\varphi_4)+$$

$$\frac{U_m^2}{(M+2N)L_r}\cdot\left[\frac{e^{2\lambda t}}{\lambda^2+\omega^2}\cdot\left(\frac{\omega}{2}\sin 2\omega t+\frac{\lambda}{2}\cos 2\omega t+\frac{1}{2}\lambda\right)+\right.$$

$$\left. C_{H3}e^{\lambda t}\cos\omega t\right]\Bigg\}\cdot(\omega-\omega_1)\Bigg\}dt$$

Where $\varphi_3$, $\varphi_4$ are phase angles generated from merging trigonometric function terms with the same frequency, $C_3$, $C_4$, $C_5$ are the constants generated in the integrating process.

2) When the inverter switches to the topology of three-phase short-circuit, the generator dynamic energy at this stage is as follows:

$$W_{G(j)}=\int\Bigg\{\Bigg[\frac{1}{k}+\frac{1}{\left(1+\frac{L_L}{L_r}\right)(1-k)+1}\Bigg]\cdot\frac{U_m^2}{L_L}\cdot$$

$$\frac{\lambda\omega}{\left(\frac{R_1}{L_1}+\lambda\right)^2+\omega^2}\cdot e^{2\lambda t}-\Bigg[\frac{1}{k}+\frac{1}{\left(1+\frac{L_L}{L_r}\right)(1-k)+1}\Bigg]\cdot$$

$$\frac{U_m^2}{L_L}\cdot\sqrt{C_1^2+\frac{1}{3}(2C_2+C_1)^2}\cdot\lambda e^{\left(\lambda-\frac{R_1}{L_1}\right)t}\cdot\sin(\omega t+\varphi_3)+$$

$$\frac{1}{1+\frac{1}{1-k}+\frac{L_L}{L_r}}\cdot\frac{U_m^2}{L_r}\cdot\frac{\lambda\omega}{\lambda^2+\omega^2}\cdot e^{2\lambda t}-\frac{1}{1+\frac{1}{1-k}+\frac{L_L}{L_r}}\cdot$$

$$\frac{U_m^2}{L_r}\cdot\sqrt{C_{H1}^2+\frac{1}{3}(2C_{H2}-C_{H1})^2}\cdot\lambda e^{\lambda t}\cdot\sin(\omega t+\varphi_1)\Bigg\}dt+$$

$$\int\Bigg\{\Bigg[\frac{1}{k}+\frac{1}{\left(1+\frac{L_L}{L_r}\right)(1-k)+1}\Bigg]\cdot\frac{U_m^2}{L_L}\cdot\frac{\frac{R_1}{L_1}+\lambda}{\left(\frac{R_1}{L_1}+\lambda\right)^2+\omega^2}\cdot$$

$$e^{2\lambda t}+\Bigg[\frac{1}{k}+\frac{1}{\left(1+\frac{L_L}{L_r}\right)(1-k)+1}\Bigg]\cdot\frac{U_m^2}{L_L}\cdot$$

$$\sqrt{C_1^2+\frac{1}{3}(2C_2+C_1)^2}\cdot e^{\left(\lambda-\frac{R_1}{L_1}\right)t}\cdot\sin(\omega t+\varphi_4)+$$

$$\frac{1}{1+\frac{1}{1-k}+\frac{L_L}{L_r}}\cdot\frac{U_m^2}{L_r}\cdot\frac{\lambda}{\lambda^2+\omega^2}\cdot e^{2\lambda t}+\frac{1}{1+\frac{1}{1-k}+\frac{L_L}{L_r}}\cdot\frac{U_m^2}{L_r}\cdot$$

$$\sqrt{C_{H1}^2+\frac{1}{3}(2C_{H2}-C_{H1})^2}\cdot e^{\lambda t}\cdot\sin(\omega t+\varphi_2)\Bigg\}\cdot(\omega-\omega_1)dt$$

3) When the inverter switches to the topology of three-phase open circuit, the generator dynamic energy at this stage is as follows:

$$W_{G(k)}=\int\Bigg[\frac{2}{k(2-k)}\cdot\frac{U_m^2}{L_L}\cdot\frac{\lambda\omega}{\left(\frac{R_1}{L_1}+\lambda\right)^2+\omega^2}\cdot e^{2\lambda t}-\frac{2}{k(2-k)}\cdot\frac{U_m^2}{L_L}\cdot$$

$$\sqrt{C_1^2+\frac{1}{3}(2C_2+C_1)^2}\cdot e^{\left(\lambda-\frac{R_1}{L_1}\right)t}\cdot\sin(\omega t+\varphi_3)\Bigg]dt+\int$$

$$\Bigg[\frac{2}{k(2-k)}\cdot\frac{U_m^2}{L_L}\cdot\frac{\frac{R_1}{L_1}+\lambda}{\left(\frac{R_1}{L_1}+\lambda\right)^2+\omega^2}\cdot e^{2\lambda t}+\frac{2}{k(2-k)}\cdot\frac{U_m^2}{L_L}\cdot$$

$$\sqrt{C_1^2+\frac{1}{3}(2C_2+C_1)^2}\cdot e^{\left(\lambda-\frac{R_1}{L_1}\right)t}\cdot\sin(\omega t+\varphi_4)\Bigg]\cdot(\omega-\omega_1)dt$$

It can be seen that, combined with the topology change of inverter under fault state, $W_{HVDC}$, $W_{Ln1}$, $W_{Ln3}$ and $W_G$ in the dynamic energy conservation equation of HVDC receiving end system can be accurately calculated by dynamic energy, which provides a solid theoretical basis for taking the attenuation intensity of generator dynamic energy as an index to evaluate the stability of HVDC receiving end system. In order to better explain the technical solution provided by the embodiment of the disclosure, three scenarios of transient stability, critical stability and transient instability are simulated by setting different fault clearing time. Voltage and current data are measured from the generator port and dynamic energy is calculated to verify the accuracy of dynamic energy and the feasibility of stability evaluation.

Figure 4:
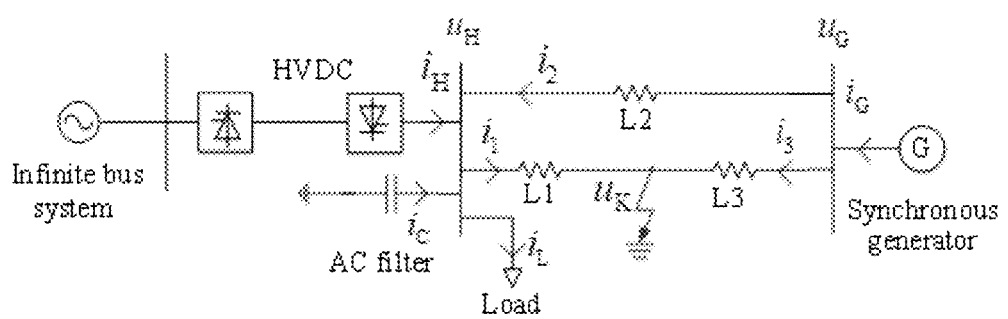
FIG. 4 shows a structure diagram of the simulation system provided by the embodiment of the disclosure.

Take the simulation system shown in FIG. 4 as an example. The sending-end system is connected to the receiving end system via an HVDC transmission lines whose rated voltage is 500 kV and rated capacity is 1000 MW. The length of the receiving-end AC lines is 130 km. The resistance per unit line length is 0.04n/km. The reactance per unit line length is 0.55 Ω/km. The rated voltage of line is 230 kV. Load is connected to the converter bus of inverter station, with the active power of load being 1200 MW and reactive power being 70 Mvar. For receiving-end synchronous generator, the rated voltage is 17.3 kV, reference capacity is 100 MVA, reference angular frequency is 100π(rad·s-1), inertia constant is 1.7 s, mechanical damping coefficient is 0.01. Three-phase grounding fault is set at t=9 s (that is, the time when the fault occurs) on either circuit line of the receiving-end double-circuit line.

Embodiment 1

Figure 5:
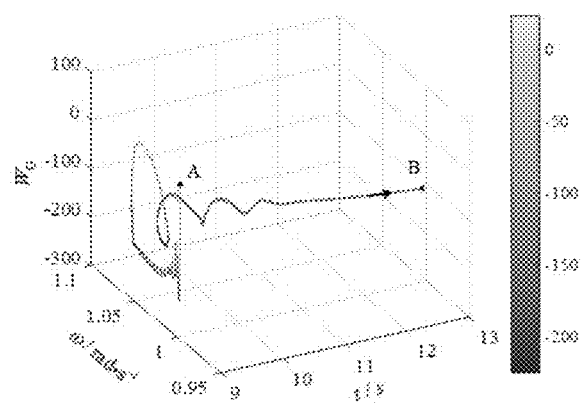
FIG. 5 shows a diagram of change trajectory of the generator dynamic energy during transient stability provided by the embodiment of the disclosure.

When the fault is eliminated at 9.25 s, the receiving end system is stable. The data collected in step 101 is substituted into the general expression of the corresponding relationship between the generator dynamic energy and the time obtained in step 102, and the energy change trajectory of the generator is calculated, as shown in FIG. 5. In the figure, point A is the starting point of the energy trajectory, and point B is the end point of the energy trajectory. It can be seen from FIG. 5 that the dynamic energy of generator goes through increasing stage during fault process, then showing a decreasing trend after fault removal and finally keeping unchanged after being reduced to a minimum, which indicates that the total energy of the receiving end system decreases continuously after the fault is removed, and the receiving end system finally returns to stability. At the same time, it can be seen that when the rotational speed of the generator is normal, the per-unit value is 1. During the fault process, the rotational speed of the generator increases. After the fault is removed, the rotational speed of the generator decreases to the per-unit value of 1 in fluctuation, indicating that the system finally returns to be stable. The stability judgment results obtained based on the energy change trend are consistent with the simulation results in time domain.

Figure 6:
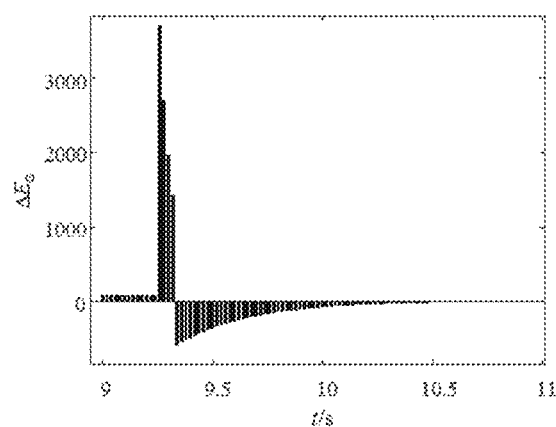
FIG. 6 is a schematic diagram showing the change of attenuation intensity of the generator dynamic energy with time during transient stability provided by the embodiment of the disclosure.

According to FIG. 5, the attenuation intensity of generator energy shown in FIG. 6 is obtained. In the case of transient stability, the attenuation intensity of generator energy is positive during the fault, indicating that the total energy of the system increases. After fault removal, the attenuation intensity of generator energy is positive and decreasing, indicating that the total energy of the system continues to increase but the increasing speed decreases gradually, and then is negative and the absolute value decreases continuously, indicating that the total energy of the system begins to decay and the decay speed decreases gradually. Finally, the attenuation intensity of generator energy is 0, which means that the total energy of the system will not change after the total energy is reduced to a constant value, and the system will return to be stable.

Embodiment 2

Figure 7:
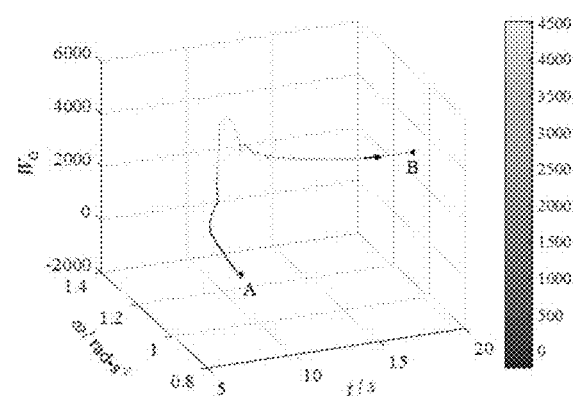
FIG. 7 shows a diagram of change trajectory of the generator dynamic energy during critical stability provided by the embodiment of the disclosure.

The fault is Eliminated at 9.9 s, and the receiving end system is critical stable. The data collected in step 101 is substituted into the general expression of the corresponding relationship between the generator dynamic energy and the time obtained in step 102, and the energy change trajectory of the generator is calculated, as shown in FIG. 7. In the figure, point A is the starting point of the energy trajectory, and point B is the end point of the energy trajectory. It can be seen from FIG. 7 that the dynamic energy of generator goes through increasing stage during fault process, then showing a decreasing trend after fault removal and finally keeping unchanged after being reduced to a minimum, which indicates that the total energy of the receiving end system decreases continuously after the fault is removed, and the receiving end system finally returns to stability. At the same time, it can be seen that when the rotational speed of the generator is normal, the per-unit value is 1. During the fault process, the rotational speed of the generator increases. After the fault is removed, the rotational speed of the generator decreases to per-unit value 1 in fluctuation, which indicates that the system finally recovers stability. The stability judgment results obtained based on the energy change trend are consistent with the simulation results in time domain.

Figure 8:
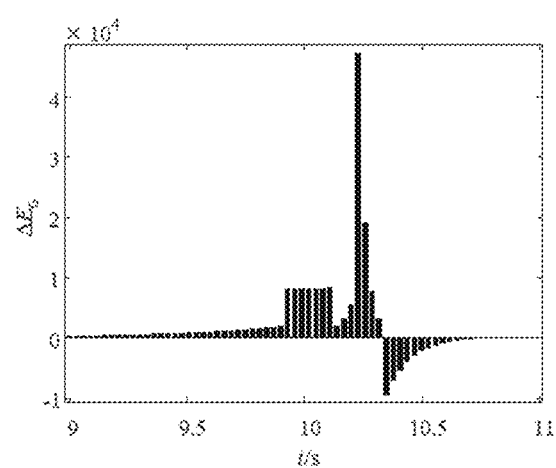
FIG. 8 is a schematic diagram showing the change of the attenuation intensity of generator energy with time during critical stability provided by the embodiment of the disclosure.

According to FIG. 7, the attenuation intensity of generator energy as shown in FIG. 8 is obtained. In the case of critical stability, the attenuation intensity of generator energy is positive during the fault period, indicating that the total energy of the system increases. After the fault is removed, the energy attenuation intensity of the generator is positive, indicating that the total energy of the system continues to increase, and then the attenuation intensity of generator energy is negative and the absolute value is continuously decreasing, indicating that the total energy of the system begins to decay and the attenuation speed gradually decreases. Finally, the attenuation intensity of generator energy is 0, which means that the total energy of the system will not change after decreasing to a constant value, and the system will return to stability Embodiment 3

Figure 9:
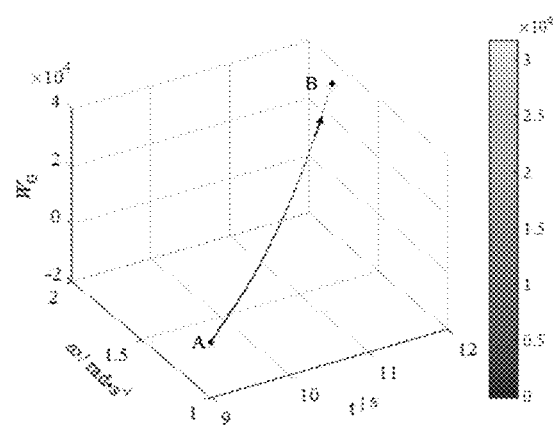
FIG. 9 is a diagram of change trajectory of the generator dynamic energy during transient instability provided by the embodiment of the disclosure.

The fault is Eliminated at 12 s, and the receiving end system is transient unstable. The data collected in step 101 is substituted into the general expression of the corresponding relationship between the generator the generator dynamic energy and the time obtained in step 102, as shown in FIG. 9. In the figure, point A is the starting point of the energy trajectory, and point B is the end point of the energy trajectory. It can be seen from FIG. 9 that the energy of the generator increases continuously during the fault process, still shows an increasing trend after the fault is removed and is finally divergent to infinity, which indicates that the total energy of the receiving end system increases continuously after the fault is removed, and the receiving end system finally go unstable. At the same time, it can be seen that when the rotational speed of the generator is normal, the per-unit value is 1. During the fault process, the rotational speed of the generator increases, and after the fault is removed, the rotational speed of the generator continues to increase, indicating that the system loses stability. The stability judgment results obtained based on the energy change trend are consistent with the simulation results in time domain.

Figure 10:
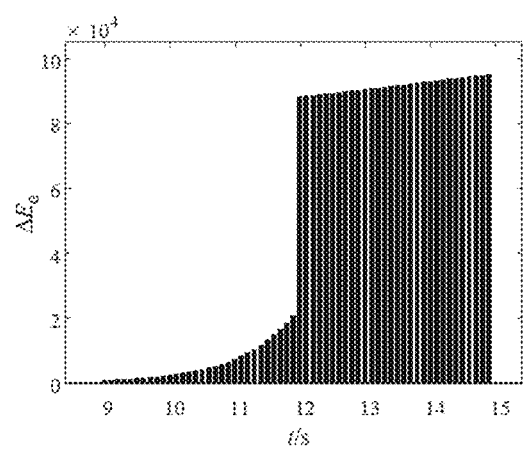
FIG. 10 is a schematic diagram of the change of the attenuation intensity of the generator energy with time during transient instability provided by the embodiment of the present disclosure.

According to FIG. 9, the attenuation intensity of generator energy as shown in FIG. 10 is obtained. In the case of transient instability, the attenuation intensity of generator energy is positive during the fault period, indicating that the total energy of the system increases. After the fault is removed, the attenuation intensity of generator energy is still positive and the absolute value is large, which indicates that the total energy of the system continues to increase and the increasing speed is fast, and the system can not reach the equilibrium state and finally lose stability.

Therefore, the total energy of the receiving end system can be expressed by the generator dynamic energy, and its change trend can reflect the transient stability of the receiving end system. The change rate of the aperiodic components of the generator dynamic energy is defined as the attenuation intensity of energy. When the attenuation intensity of energy is negative or 0, the system can maintain transient stability; when the energy attenuation intensity is positive, the system will be transient unstable. In the case of transient stability, critical stability and transient instability, the stability judgment results obtained based on energy attenuation intensity are consistent with the corresponding simulation results in time domain.

It can be seen from the above experiments that the dynamic energy at the port can be calculated only by collecting voltage and current data at the port in the technical solution provided by the embodiment of the disclosure, so the consuming time for calculation of the technical solution provided by the embodiment of the disclosure is 10 s. The simulation method in time domain solves the differential algebraic equations of the system to obtain the change trajectory of the system state quantity and algebraic quantity over time. Solving nonlinear differential equations requires a lot of work and time-consuming is long. The transient energy function method needs to calculate the unstable equilibrium point of the AC/DC system after the fault is removed. This process takes a long time. Therefore, the consuming time for calculation of the time domain simulation method is 180 s, and the the consuming time for calculation of the transient energy function method is 15 s. To sum up, the technical solution provided by the embodiments of the present disclosure have better performance in calculation speed.

Figure 11:
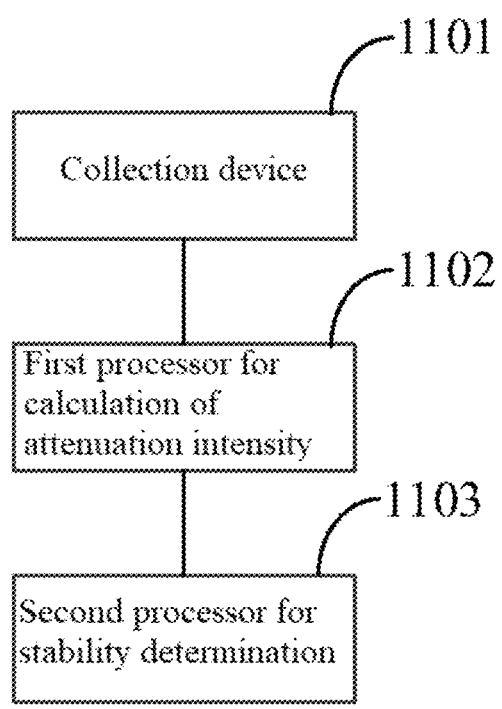
FIG. 11 is a structural diagram of a system for evaluating the stability of a HVDC receiving end system provided by an embodiment of the present disclosure.

The embodiment of the disclosure provides a system for evaluating the stability of HVDC receiving end system including: collection device 1101, first processor for calculation of attenuation intensity 1102 and second processor for stability determination 1103, as shown in FIG. 11. Either of the first processor, the second processor is independent processor, or both processors are integrated in a single processor.

Collection device 1101 is used to collect voltage, current at generator port and speed of generator after eliminating fault.

The first processor for calculation of attenuation intensity 1102 is used to determine the corresponding relationship between the generator dynamic energy and the time according to the voltage at the generator port, the current at the generator port and the speed of the generator; and determine the attenuation intensity of the generator dynamic energy according to the corresponding relationship between the generator dynamic energy and the time.

The second processor for stability determination 1103 is used to determine the stability of HVDC receiving end system according to the attenuation intensity of generator dynamic energy.

In the embodiment of the disclosure, determining the stability of the HVDC receiving end system according to the attenuation intensity of the generator dynamic energy including:

The second processor for stability determination 1103 is used to determine that the HVDC receiving end system is in stable state when the attenuation intensity of the generator dynamic energy is not greater than 0; when the attenuation intensity of the generator dynamic energy is greater than 0, the HVDC receiving end system is in unstable state; among them, the attenuation intensity of generator dynamic energy is the change amount of generator dynamic energy in unit time.

The second processor for stability determination is configured to: determine first duration that the attenuation intensity of the generator dynamic energy is not greater than 0; determine that the HVDC receiving end system is in the stable state when the first duration reaches first preset time.

The second processor for stability determination is configured to: determine second duration that the attenuation intensity of the generator dynamic energy is greater than 0; determine that the HVDC receiving end system is in the unstable state when the second duration reaches second preset time.

In the embodiment of the disclosure, the first processor for calculation of attenuation intensity 1102 is used to determine the corresponding relationship between the aperiodic components in the generator dynamic energy and the time according to the corresponding relationship between the generator dynamic energy and the time; determine the attenuation intensity of generator dynamic energy according to corresponding relationship between the aperiodic components and the time; the attenuation intensity of generator dynamic energy is the change amount of aperiodic components in generator dynamic energy in unit time.

In the embodiment of the disclosure, the corresponding relationship between the generator dynamic energy and the time is expressed by the following formula:

$$W_G = \int \left( i_{Gd} \cdot \frac{du_{Gq}}{dt} - i_{Gq} \cdot \frac{du_{Gd}}{dt} \right) dt + \int (i_{Gd} u_{gd} + i_{Gq} u_{Gq}) \cdot (\omega - \omega_1) dt$$

Where $u_{Gd}$, $u_{Gq}$ are respectively the d and q axis components in voltage at generator port, $i_{Gd}$, $i_{Gq}$ are respectively the d and q axis components in current at generator port, $\omega$ is the rotational speed of the generator, $\omega_1$ is the synchronous speed, $\omega_1 = 100\pi$.

A non-transitory machine-readable storage medium comprising instructions that when executed cause a processor of a computing device to: collect voltage at a generator port, current at the generator port and rotation speed of the generator after fault is eliminated; determine a corresponding relationship between generator dynamic energy and time according to the voltage at the generator port, the current at the generator port and the rotational speed of the generator; determine attenuation intensity of the generator dynamic energy according to the corresponding relationship between the generator dynamic energy and the time; determine the stability of the HVDC receiving end system according to the attenuation intensity of the generator dynamic energy.

It can be understood by those skilled in the art that all or part of the process of realizing the method in the above embodiment can be completed by instructing relevant hardware by computer program, and the program can be stored in a computer-readable storage medium, wherein the computer-readable storage medium is disk, optical disk, read-only memory or random memory, etc.

The above is only a better specific embodiment of the disclosure, but the protection scope of the disclosure is not limited to this. Any change or replacement that can be easily thought of by any person familiar with the technical field within the technical scope disclosed by the disclosure shall be included in the protection scope of the disclosure.

The foregoing descriptions of specific exemplary embodiments of the present disclosure have been presented for purposes of illustration and description. They are not intended to be exhaustive or to limit the disclosure to the precise forms disclosed, and obviously many modifications and variations are possible in light of the above teachings. The exemplary embodiments were chosen and described in order to explain certain principles of the disclosure and their practical disclosure, to thereby enable others skilled in the art to make and utilize various exemplary embodiments of the present disclosure, as well as various alternatives and modifications thereof. It is intended that the scope of the disclosure be defined by the Claims appended hereto and their equivalents.

What is claimed is:

1. A method for evaluating stability of HVDC receiving end system, comprising:
   collecting voltage at a generator port, current at the generator port and rotation speed of the generator after fault is eliminated by removing the three-phase grounding fault;
   determining a corresponding relationship between generator dynamic energy and time according to the voltage at the generator port, the current at the generator port and the rotational speed of the generator;
   determining attenuation intensity of the generator dynamic energy according to the corresponding relationship between the generator dynamic energy and the time;
   determining the stability of the HVDC receiving end system according to the attenuation intensity of the generator dynamic energy;
   wherein the corresponding relationship between the generator dynamic energy and the time is expressed as follows:
   where W_G is the generator dynamic energy, are respectively the d and q axis components in voltage at the generator port, are respectively the d and q axis components in current at the generator port, w is the rotational speed of the generator, is the synchronous speed;
   wherein HVDC receiving end system comprises the AC system connected to an inverter side of HVDC transmission system, having port of DC inverter side, AC transmission lines, load, AC filter and synchronous generator, and the port of DC inverter side, load and AC filter are located on the inverter side, and are connected to a synchronous generator through AC transmission lines.

2. The method according to claim 1, determining the stability of the HVDC receiving end system according to the attenuation intensity of the generator dynamic energy comprises:
   determining that the HVDC receiving end system is in a stable state when the attenuation intensity of the generator dynamic energy is not greater than 0; and
   determining that the HVDC receiving end system is in an unstable state when the attenuation intensity of the generator dynamic energy is greater than 0;
   wherein the attenuation intensity of the generator dynamic energy is the change amount of the generator dynamic energy in unit time.

3. The method according to claim 2, determining that the HVDC receiving end system is in the stable state when the attenuation intensity of the generator dynamic energy is not greater than 0 comprises:
   determining first duration that the attenuation intensity of the generator dynamic energy is not greater than 0;
   determining that the HVDC receiving end system is in the stable state when the first duration reaches first preset time.

4. The method according to claim 2, determining that the HVDC receiving end system is in the unstable state when the attenuation intensity of the generator dynamic energy is greater than 0 comprises:
   determining second duration that the attenuation intensity of the generator dynamic energy is greater than 0;
   determining that the HVDC receiving end system is in the unstable state when the second duration reaches second preset time.

5. The method according to claim 1, determining attenuation intensity of the generator dynamic energy according to the corresponding relationship between the generator dynamic energy and the time comprises:
   determining a corresponding relationship between aperiodic components in the generator dynamic energy and the time according to the corresponding relationship between the generator dynamic energy and the time;
   determining the attenuation intensity of the generator dynamic energy according to the corresponding relationship between the aperiodic components and the time;
   wherein the attenuation intensity of the generator dynamic energy is change amount of the aperiodic components in the generator dynamic energy in unit time.

6. A system for evaluating stability of HVDC receiving end system comprising:
   a collection device configured to collect voltage at a generator port, current at the generator port and rotational speed of the generator after fault is eliminated by removing the three-phase grounding fault;
   a first processor for calculation of attenuation intensity configured to determine a corresponding relationship between generator dynamic energy and time according to the voltage at the generator port, the current at the generator port and the rotational speed of the generator, and configured to determine the attenuation intensity of the generator dynamic energy according to the corresponding relationship between the generator dynamic energy and the time;
   a second processor for stability determination configured to determine the stability of the HVDC receiving end system according to the attenuation intensity of the generator dynamic energy;
   wherein the corresponding relationship between the generator dynamic energy and the time is expressed as follows:
   where W_G is the generator dynamic energy, are respectively the d and q axis components in voltage at the generator port, are respectively the d and q axis components in current at the generator port, w is the rotational speed of the generator, is the synchronous speed;
   wherein HVDC receiving end system comprises the AC system connected to an inverter side of HVDC transmission system, having port of DC inverter side, AC transmission lines, load, AC filter and synchronous generator, and the port of DC inverter side, load and AC filter are located on the inverter side, and are connected to a synchronous generator through AC transmission lines.

7. The system according to claim 6, the second processor for stability determination is further configured to determine that the HVDC receiving end system is in a stable state when the attenuation intensity of the generator dynamic energy is not greater than 0; and determine that the HVDC receiving end system is in an unstable state when the attenuation intensity of the generator dynamic energy is greater than 0;

wherein the attenuation intensity of the generator dynamic energy is change amount of the generator dynamic energy in unit time.

8. The system according to claim 7, the second processor for stability determination is configured to:

determine first duration that the attenuation intensity of the generator dynamic energy is not greater than 0;

determine that the HVDC receiving end system is in the stable state when the first duration reaches first preset time.

9. The system according to claim 7, the second processor for stability determination is configured to:

determine second duration that the attenuation intensity of the generator dynamic energy is greater than 0;

determine that the HVDC receiving end system is in the unstable state when the second duration reaches second preset time.

10. The system according to claim 6, the first processor for calculation of attenuation intensity configured to determine the attenuation intensity of the generator dynamic energy according to the corresponding relationship between the generator dynamic energy and the time comprises:

the first processor for calculation of attenuation intensity is further configured to determine a corresponding relationship between aperiodic components in the generator dynamic energy and the time according to the corresponding relationship between the generator dynamic energy and the time, and configured to determine the attenuation intensity of the generator dynamic energy according to the corresponding relationship between the aperiodic components and the time;

wherein the attenuation intensity of the generator dynamic energy is change amount of the aperiodic components in the generator dynamic energy in unit time.

\* \* \* \* \*